US012646572B2

(12) United States Patent　　　　　(10) Patent No.:　US 12,646,572 B2
Cen et al.　　　　　　　　　　　　　(45) Date of Patent:　　　　Jun. 2, 2026

(54) VOLTAGE CONTROL IN MEMORY DEVICES

(71) Applicant: Yangtze Memory Technologies Co., Ltd., Wuhan (CN)

(72) Inventors: Yiqun Cen, Wuhan (CN); Li Xiang, Wuhan (CN); Ruxin Wei, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 236 days.

(21) Appl. No.: 18/399,613

(22) Filed: Dec. 28, 2023

(65) Prior Publication Data

US 2025/0157550 A1　　May 15, 2025

(30) Foreign Application Priority Data

Nov. 13, 2023　(CN) ......................... 202311515625.7

(51) Int. Cl.
　*G11C 11/34*　　　(2006.01)
　*G11C 16/04*　　　(2006.01)
　*G11C 16/30*　　　(2006.01)
(52) U.S. Cl.
　CPC .......... *G11C 16/30* (2013.01); *G11C 16/0483* (2013.01)

(58) Field of Classification Search
　CPC ...... G11C 16/30; G11C 16/0483; G11C 16/08
　USPC ..................................................... 365/185.01
　See application file for complete search history.

(56) References Cited

U.S. PATENT DOCUMENTS

| | | | | |
|---|---|---|---|---|
| 6,483,357 B2 * | 11/2002 | Kato | ........................ | G05F 1/465 |
| | | | | 327/143 |
| 6,836,522 B1 * | 12/2004 | Wakayama | ............. | H03L 7/087 |
| | | | | 375/376 |
| 7,376,017 B2 * | 5/2008 | Kim | ................... | G11C 16/3418 |
| | | | | 365/185.23 |
| 2005/0143032 A1 * | 6/2005 | Matsushita | ............ | H03D 3/008 |
| | | | | 455/232.1 |
| 2005/0168263 A1 * | 8/2005 | Fukuda | ................. | H02M 3/073 |
| | | | | 327/535 |

* cited by examiner

*Primary Examiner* — Tha-O H Bui
(74) *Attorney, Agent, or Firm* — Fish & Richardson P.C.

(57) ABSTRACT

Memory devices, circuits, and methods for voltage control in memory devices are provided. One example method includes adjusting a rate of change of a reference voltage based on a step voltage and a step time duration, where adjusting the rate of change of the reference voltage includes changing the reference voltage by the step voltage over a time period that equals the step time duration. An output voltage from one or more charge pumps is generated using the reference voltage, where a ratio between the output voltage and the reference voltage is locked.

20 Claims, 10 Drawing Sheets

100

400

402

600

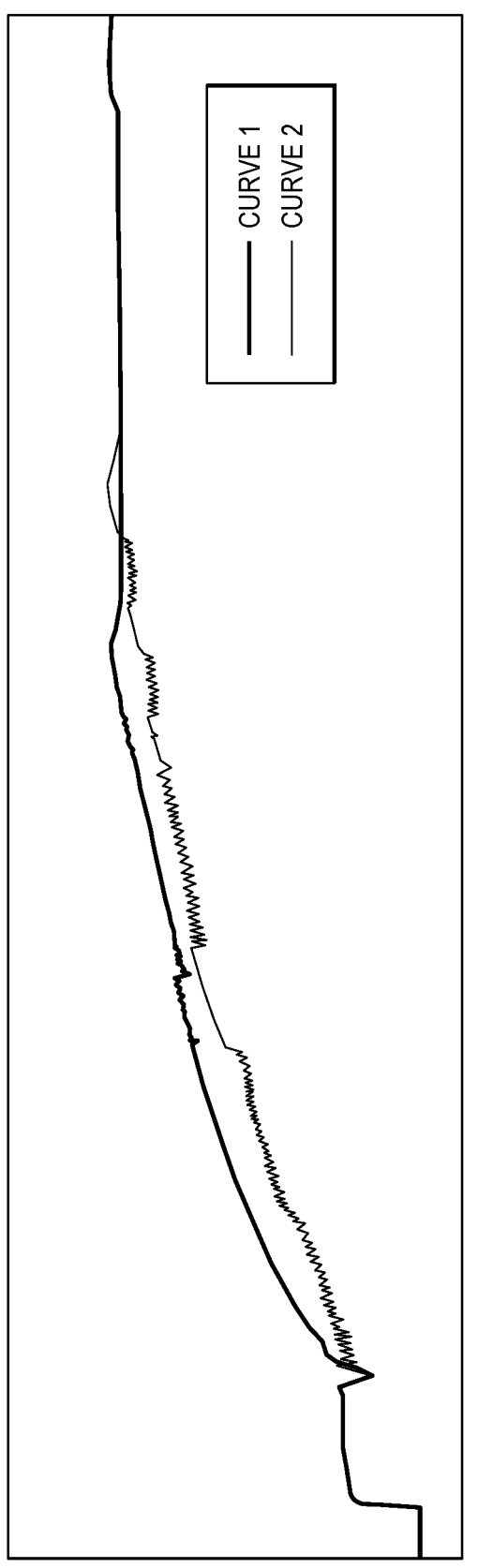
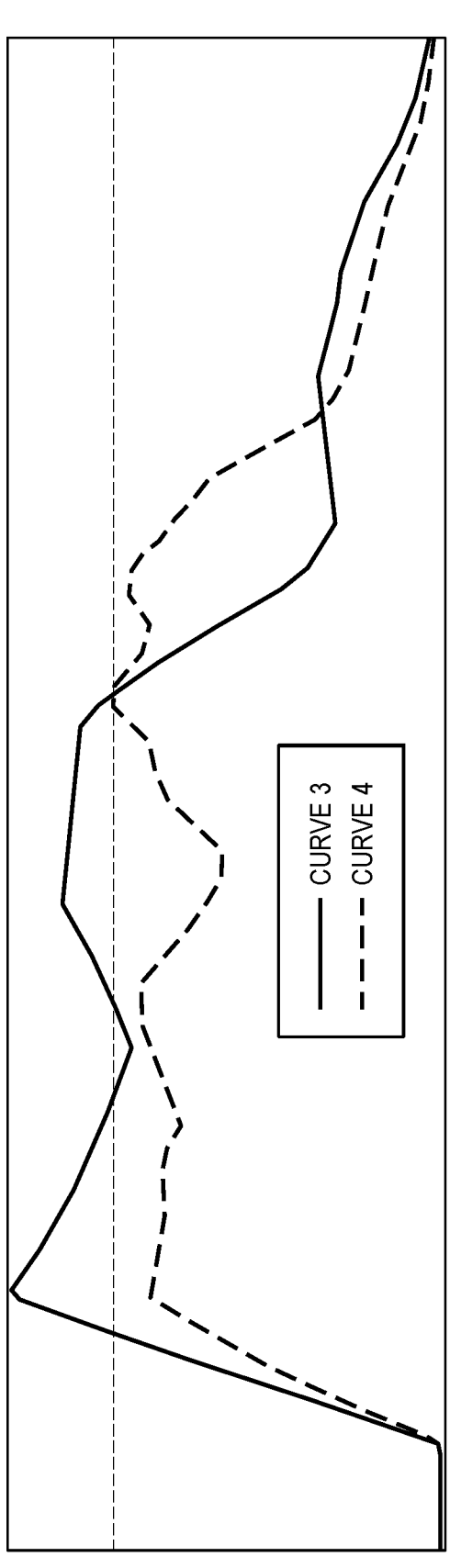
FIG. 8

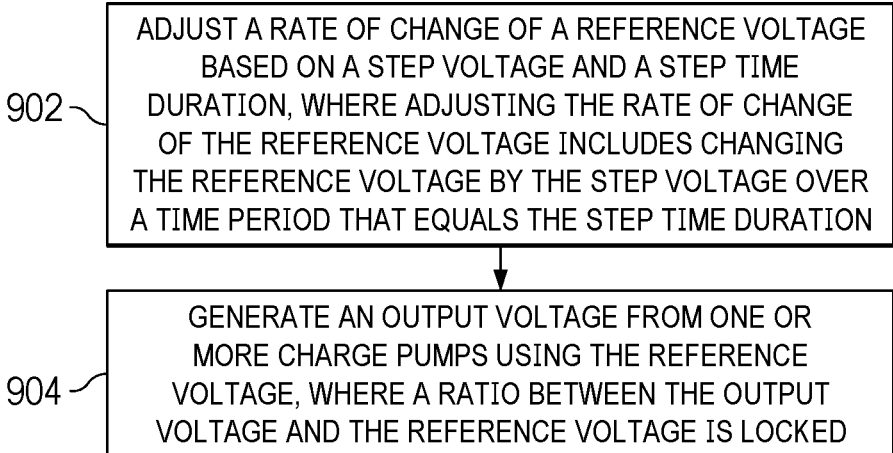

902 — ADJUST A RATE OF CHANGE OF A REFERENCE VOLTAGE BASED ON A STEP VOLTAGE AND A STEP TIME DURATION, WHERE ADJUSTING THE RATE OF CHANGE OF THE REFERENCE VOLTAGE INCLUDES CHANGING THE REFERENCE VOLTAGE BY THE STEP VOLTAGE OVER A TIME PERIOD THAT EQUALS THE STEP TIME DURATION

904 — GENERATE AN OUTPUT VOLTAGE FROM ONE OR MORE CHARGE PUMPS USING THE REFERENCE VOLTAGE, WHERE A RATIO BETWEEN THE OUTPUT VOLTAGE AND THE REFERENCE VOLTAGE IS LOCKED

FIG. 9

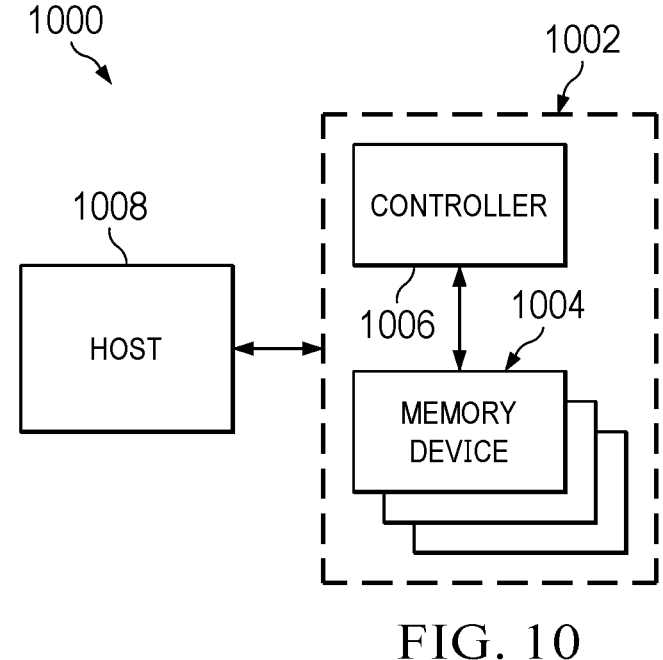

FIG. 10

VOLTAGE CONTROL IN MEMORY DEVICES

CROSS-REFERENCE TO RELATED APPLICATIONS

This application claims priority to Chinese Patent Application No. 202311515625.7, filed on Nov. 13, 2023, which is hereby incorporated by reference in its entirety.

TECHNICAL FIELD

The present disclosure relates to memory devices, circuits, and methods for voltage control in memory devices.

BACKGROUND

Voltage generators, for example, charge pumps, can provide voltages to support operations in memory devices. An example of a memory device is a flash memory. Flash memory is a low-cost, high-density, nonvolatile solid-state storage medium that can be electrically erased and reprogrammed. Flash memory includes NOR flash memory and NAND flash memory. Various operations can be performed by flash memories, for example, read, program (write), and erase operations.

SUMMARY

The present disclosure relates to memory devices, circuits, and methods for voltage control in memory devices.

Certain aspects of the subject matter described here can be implemented as a circuit. The circuit includes one or more charge pumps and a reference voltage generation circuit. The reference voltage generation circuit includes an adder configured to adjust a rate of change of an output voltage of the one or more charge pumps, where inputs of the adder include a step size and a step frequency, and an output of the adder changes by the step size over a time period that equals an inverse of the step frequency to adjust the rate of change of the output voltage.

The circuit can include one or more of the following features.

In some implementations, the reference voltage generation circuit further includes a first comparator coupled to the adder, inputs of the first comparator include a threshold and the output of the adder, and an output of the first comparator controls a first operation mode of the adder based on a comparison between the threshold and the output of the adder.

In some implementations, the reference voltage generation circuit further includes a decoder configured to generate an output for decoding the output of the adder.

In some implementations, the reference voltage generation circuit further includes a digital to analog converter coupled to the output of the decoder, where the digital to analog converter is configured to convert the decoded output of the adder to a reference voltage as an output of the reference voltage generation circuit.

In some implementations, the reference voltage generation circuit is configured to output a reference voltage based on the output of the adder during a charge pump operating period, and the charge pump operating period includes one or more time periods during which a ratio between the output voltage of the one or more charge pumps and the reference voltage is locked.

In some implementations, the reference voltage in the charge pump operating period includes three consecutive segments including a first segment, a second segment, and a third segment, the reference voltage in the first segment is a first constant, and the reference voltage in the third segment is a second constant greater than the first constant.

In some implementations, the second segment includes two or more consecutive subsegments corresponding to two or more rates of change of the reference voltage.

In some implementations, the circuit further includes a charge pump output feedback circuit configured to output a feedback voltage during the charge pump operating period, and a ratio of the feedback voltage to the output voltage of the one or more charge pumps during the charge pump operating period is predetermined.

In some implementations, the charge pump output feedback circuit includes a plurality of resistors.

In some implementations, the circuit further includes a second comparator, inputs of the second comparator include the feedback voltage and the reference voltage, and an output of the second comparator controls a second operation mode of the one or more charge pumps based on a comparison between the feedback voltage and the reference voltage.

In some implementations, the circuit further includes one or more clock drivers, input of the one or more clock drivers is the output of the second comparator, and the one or more clock drivers are configured to provide one or more clock signals to the one or more charge pumps based on the output of the second comparator.

In some implementations, a configuration of the one or more charge pumps includes a series connection of the one or more charge pumps or a parallel connection of the one or more charge pumps.

In some implementations, the configuration of the one or more charge pumps is switched from the parallel connection to the series connection when the output voltage of the one or more charge pumps is greater than a switching threshold.

Certain aspects of the subject matter described here can be implemented as a method. The method includes adjusting a rate of change of a reference voltage based on a step voltage and a step time duration, where adjusting the rate of change of the reference voltage includes changing the reference voltage by the step voltage over a time period that equals the step time duration. An output voltage from one or more charge pumps is generated using the reference voltage, where a ratio between the output voltage and the reference voltage is locked.

The method can include one or more of the following features.

In some implementations, a configuration of the one or more charge pumps includes a series connection of the one or more charge pumps or a parallel connection of the one or more charge pumps. The method further includes determining that an output voltage of one or more charge pumps is greater than a switching threshold, and in response to determining that the output voltage of the one or more charge pumps is greater than the switching threshold, switching the configuration of the one or more charge pumps from the parallel connection to the series connection.

In some implementations, adjusting the rate of change of the reference voltage further includes determining that the reference voltage is greater than or equal to a voltage threshold, and in response to determining that the reference voltage is greater than or equal to the voltage threshold, setting the rate of change of the reference voltage to zero.

In some implementations, adjusting the rate of change of the reference voltage further includes changing the step voltage or changing the step time duration.

In some implementations, a length of the step time duration is an inverse of a step frequency, and adjusting the rate of change of the reference voltage based on the step voltage and the step time duration includes adjusting the rate of change of the reference voltage based on the step voltage and the step frequency.

In some implementations, generating the output voltage from the one or more charge pumps based on the reference voltage includes comparing the reference voltage to a feedback voltage to determine an operation mode of the one or more charge pumps, and a ratio of the feedback voltage to the output voltage of the one or more charge pumps is predetermined.

Certain aspects of the subject matter described here can be implemented as a memory device. The memory device includes a memory cell array and a circuit. The memory cell array includes memory cells. The circuit includes one or more charge pumps operable to provide an output voltage to a word line coupled to one of the memory cells of the memory cell array. A reference voltage generation circuit, where the reference voltage generation circuit includes an adder configured to adjust a rate of change of an output voltage of the one or more charge pumps, where inputs of the adder include a step size and a step frequency, and where an output of the adder changes by the step size over a time period that equals an inverse of the step frequency to adjust the rate of change of the output voltage.

The details of these and other aspects and implementations of the present disclosure are set forth in the accompanying drawings and the description below. Other features, objects, and advantages of the disclosure will be apparent from the description and drawings, and from the claims.

BRIEF DESCRIPTION OF DRAWINGS

FIG. 8 illustrates an example of simulation results of charge pump output voltage and corresponding peak input current, according to some aspects of the present disclosure.

FIG. 9 illustrates an example of a flow chart of a method for controlling charge pump voltages in a memory device, according to some aspects of the present disclosure.

FIG. 10 illustrates a block diagram of an example system having a memory device, according to some aspects of the present disclosure.

Like reference numbers and designations in the various drawings indicate like elements.

DETAILED DESCRIPTION

This specification relates to memory devices, circuits, and methods for voltage control in memory devices. In some cases, charge pumps can provide different voltages to support operations in three-dimensional (3D) NAND flash memories. For example, a set of charge pumps in a 3D NAND flash memory can provide a bias voltage to a word line that is not selected for programming during programming operation of a memory cell in a 3D NAND flash memory. The bias voltage provided by the set of charge pumps to the unselected word line can increase from a relatively low value, for example, 1.8 V, to a relatively high value, for example, 10 V, during the programming operation of the memory cell in the 3D NAND flash memory. The aforementioned increase of the bias voltage to the unselected word line can result in large peak input current to the set of charge pumps. To reduce peak input current without significantly reducing the rate at which the bias voltage increases during programming operations of the 3D NAND flash memory, a reference voltage generation circuit can be used. The reference voltage generation circuit can control the rate of increase of a reference voltage, which in turn, controls the rate of increase of the bias voltage from the set of charge pumps. As such, when the peak input current is relatively high, the reference voltage generation circuit can increase the bias voltage at a slower rate. When the peak input current is relatively low, the reference voltage generation circuit can increase the bias voltage at a higher rate.

Implementations of the present disclosure can provide one or more of the following technical advantages. For example, the reference voltage generation circuit can use the reference voltage to adjust the rate of change of the bias voltage from the charge pumps. As such, the peak input current to the charge pumps can be reduced without significantly reducing the rate the bias voltage increases during programming operations of the 3D NAND flash memory. Moreover, different rates of change of the voltage from the charge pumps can be preset for different operations of a NAND flash memory, so that the charge pumps can support different operations in NAND flash memories more efficiently.

Figure 1:
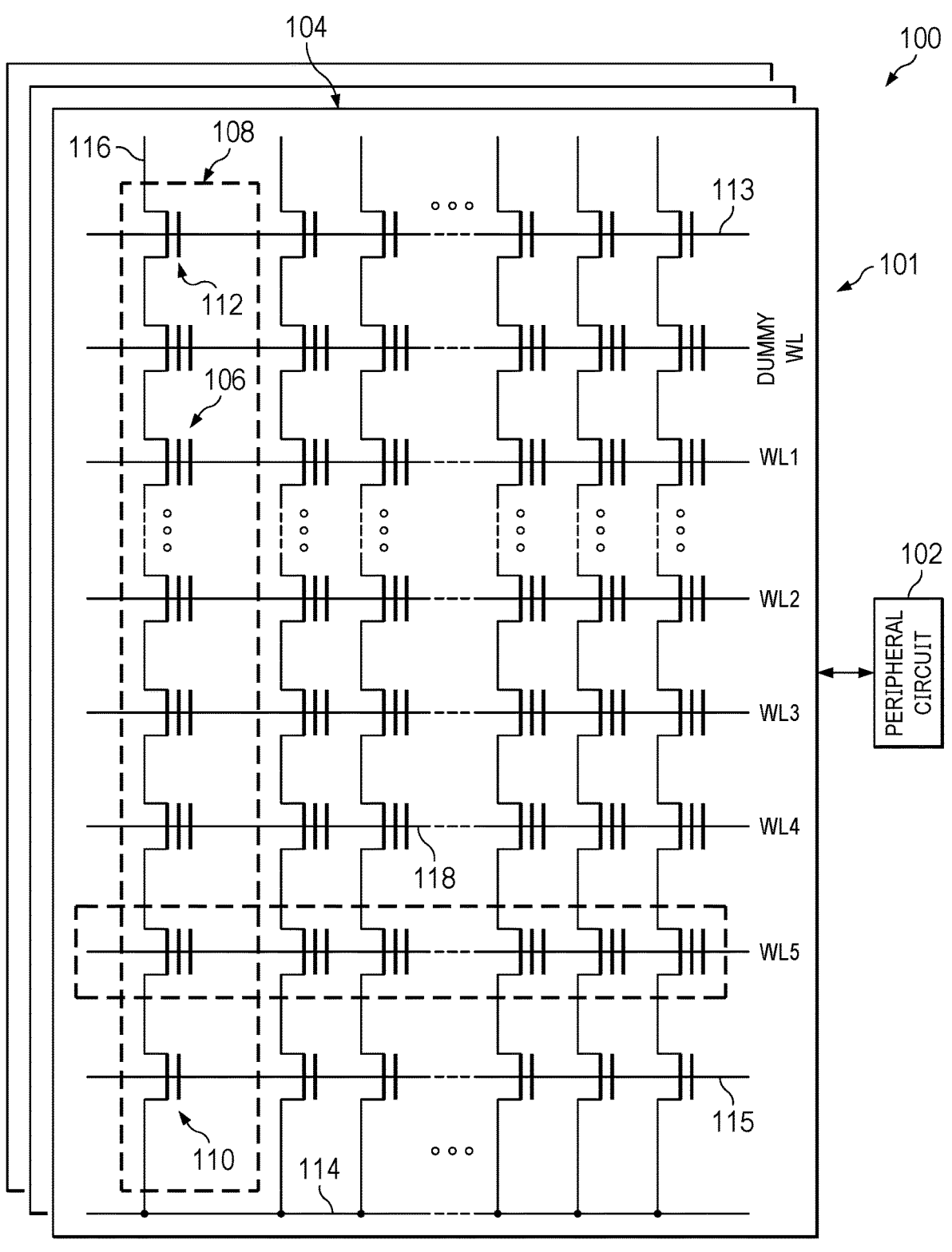
FIG. 1 illustrates an example of a schematic circuit diagram of a memory device including peripheral circuits, according to some aspects of the present disclosure.

FIG. 1 illustrates an example of a schematic circuit diagram of a memory device 100 including peripheral circuits, according to some aspects of the present disclosure. Memory device 100 can include a memory cell array 101 and peripheral circuits 102 coupled to memory cell array 101. Memory cell array 101 can be a NAND Flash memory cell array in which memory cells 106 are provided in the form of an array of NAND memory strings 108 each extending vertically above a substrate (not shown). In some implementations, each NAND memory string 108 includes a plurality of memory cells 106 coupled in series and stacked vertically. Each memory cell 106 can hold a continuous, analog value, such as an electrical voltage or charge that depends on the number of electrons trapped within a region of memory cell 106. Each memory cell 106 can be either a floating gate type of memory cell including a floating-gate transistor or a charge trap type of memory cell including a charge-trap transistor.

In some implementations, each memory cell 106 is a single-level cell (SLC) that has two possible memory states and thus, can store one bit of data. For example, the first memory state "0" can correspond to a first range of voltages, and the second memory state "1" can correspond to a second range of voltages. In some implementations, each memory cell 106 is a multi-level cell (MLC) that is capable of storing more than a single bit of data in more than four memory states. For example, the MLC can store two bits per cell, three bits per cell (also known as triple-level cell (TLC)), or four bits per cell (also known as a quad-level cell (QLC)). Each MLC can be programmed to assume a range of possible nominal storage values. In one example, if each MLC stores two bits of data, then the MLC can be programmed to assume one of three possible programming levels from an erased state by writing one of three possible nominal storage values to the cell. A fourth nominal storage value can be used for the erased state.

As shown in FIG. 1 each NAND memory string 108 can include a source select gate (SSG) 110 at its source end and a drain select gate (DSG) 112 at its drain end. SSG 110 and DSG 112 can be configured to activate selected NAND memory strings 108 (columns of the array) during read and program operations. In some implementations, the sources of NAND memory strings 108 in the same block 104 are coupled through a same source line (SL) 114, e.g., a common SL. In other words, all NAND memory strings 108 in the same block 104 have an array common source (ACS), according to some implementations. DSG 112 of each NAND memory string 108 is coupled to a respective bit line 116 from which data can be read or written via an output bus (not shown), according to some implementations. In some implementations, each NAND memory string 108 is configured to be selected or deselected by applying a select voltage or a deselect voltage (e.g., 0 V) to respective DSG 112 through one or more DSG lines 113, and/or by applying a select voltage or a deselect voltage (e.g., 0 V) to respective SSG 110 through one or more SSG lines 115.

As shown in FIG. 1, NAND memory strings 108 can be organized into multiple blocks 104, each of which can have a common source line 114, e.g., coupled to the ACS. In some implementations, each block 104 is the basic data unit for erase operations, i.e., all memory cells 106 on the same block 104 are erased at the same time. To erase memory cells 106 in a selected block 104, source lines 114 coupled to selected block 104 as well as unselected blocks 104 in the same plane as selected block 104 can be biased with an erase voltage (Vers), such as a high positive voltage (e.g., 20 V or more). In some examples, erase operation may be performed at a half-block level, a quarter-block level, or a level having any suitable number of blocks or any suitable fractions of a block. Memory cells 106 of adjacent NAND memory strings can be coupled through word lines 118 that select which row of memory cells 106 is affected by read and program operations. Each word line 118 can include a plurality of control gates (gate electrodes) at each memory cell 106 and a gate line coupling the control gates. Example word lines (WLs) shown in FIG. 1 include dummy WL, WL1, WL2, WL3, WL4, and WL5 that are between one or more DSG lines 113 and one or more SSG lines 115.

Figure 2:
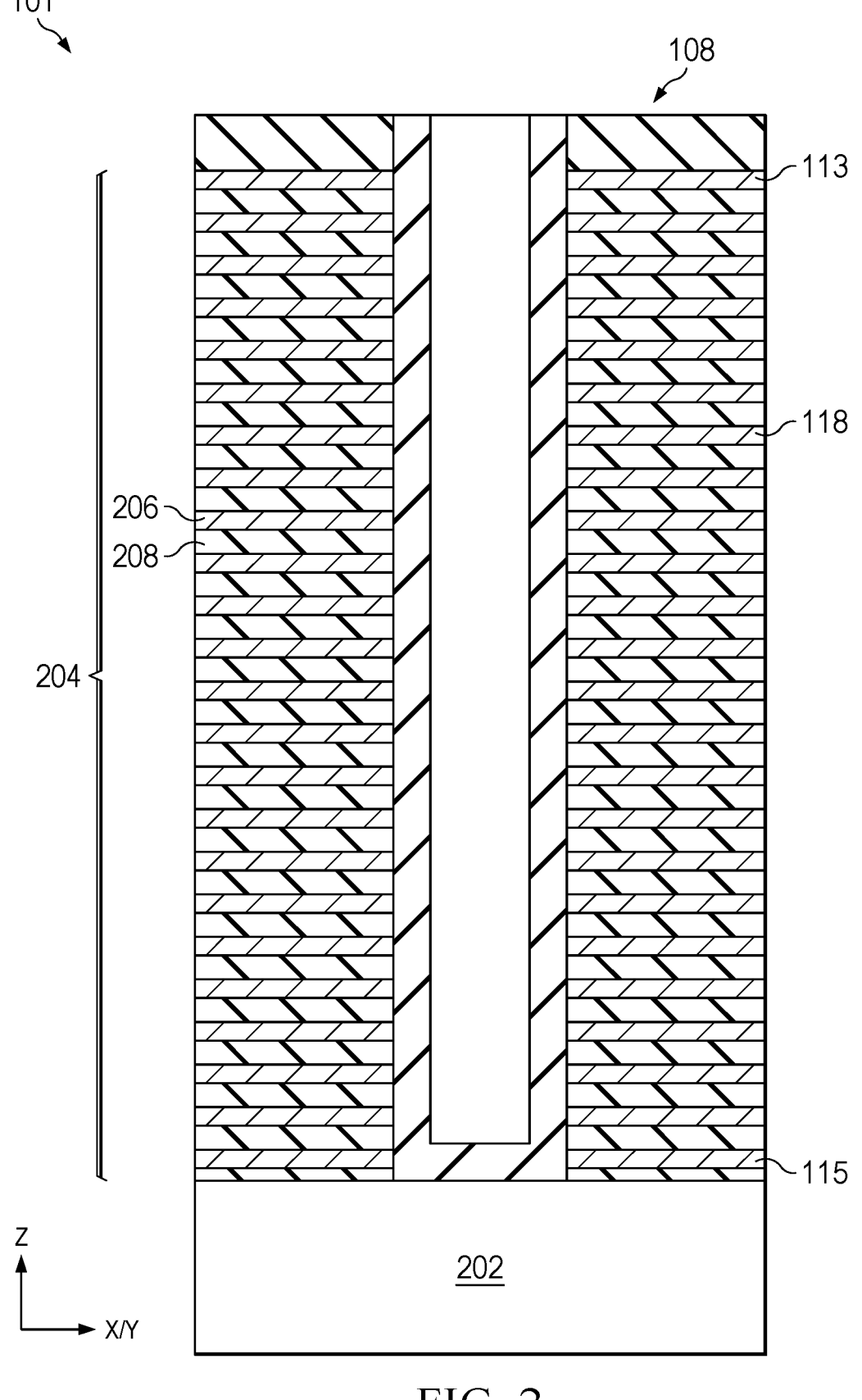
FIG. 2 illustrates an example of a side view of cross-sections of a memory cell array including NAND memory strings, according to some aspects of the present disclosure.

FIG. 2 illustrates an example of a side view of cross-sections of a memory cell array 101 including NAND memory strings 108, according to some aspects of the present disclosure. As shown in FIG. 2, NAND memory string 108 can extend vertically through a memory stack 204 above a substrate 202. Substrate 202 can include silicon (e.g., single crystalline silicon), silicon germanium (SiGe), gallium arsenide (GaAs), germanium (Ge), silicon on insulator (SOI), germanium on insulator (GOI), or any other suitable materials.

Memory stack 204 can include interleaved gate conductive layers 206 and gate-to-gate dielectric layers 208. The number of the pairs of gate conductive layers 206 and gate-to-gate dielectric layers 208 in memory stack 204 can determine the number of memory cells 106 in memory cell array 101. Gate conductive layer 206 can include conductive materials including, but not limited to, tungsten (W), cobalt (Co), copper (Cu), aluminum (Al), polysilicon, doped silicon, silicides, or any combination thereof. In some implementations, each gate conductive layer 206 includes a metal layer, such as a tungsten layer. In some implementations, each gate conductive layer 206 includes a doped polysilicon layer. Each gate conductive layer 206 can include control gates surrounding the memory cells 106, DSG 112, or SSG 110, and can extend laterally as DSG line 113 at the top of memory stack 204, SSG line 115 at the bottom of memory stack 204, or word line 118 between DSG line 113 and SSG line 115.

Figure 3:
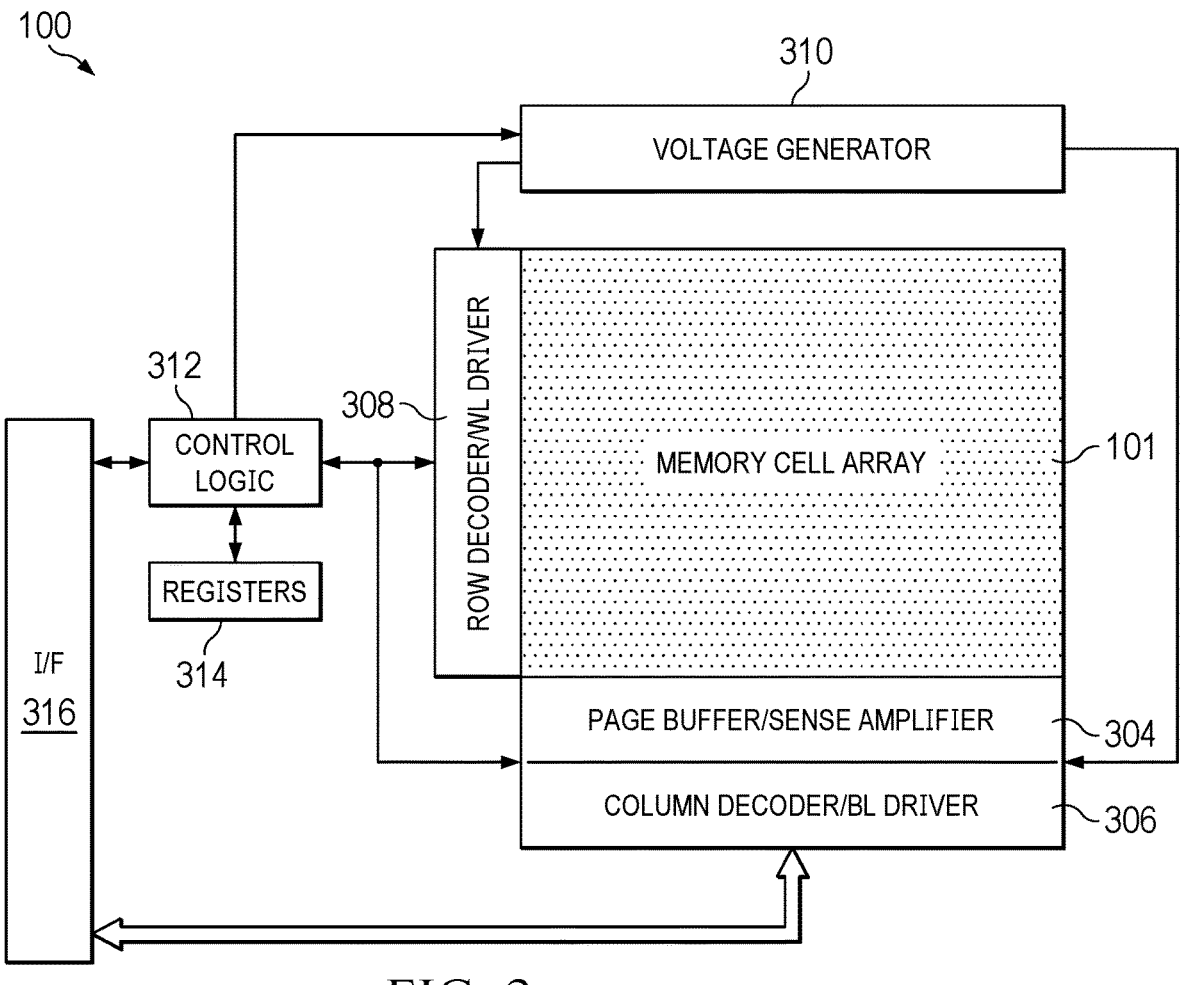
FIG. 3 illustrates an example of transactions between a host and a device, according to some aspects of the present disclosure.

Peripheral circuits 102 can be coupled to memory cell array 101 through bit lines 116, word lines 118, source lines 114, SSG lines 115, and DSG lines 113. Peripheral circuits 102 can include any suitable analog, digital, and mixed-signal circuits for facilitating the operations of memory cell array 101 by applying and sensing voltage signals and/or current signals to and from each target memory cell of the memory cells 106 through bit lines 116, word lines 118, source lines 114, SSG lines 115, and DSG lines 113. Peripheral circuits 102 can include various types of peripheral circuits formed using metal-oxide-semiconductor (MOS) technologies. For example, FIG. 3 illustrates some example peripheral circuits, according to some aspects of the present disclosure. The example peripheral circuits include a page buffer/sense amplifier 304, a column decoder/bit line driver 306, a row decoder/word line driver 308, a voltage generator 310, control logic 312, registers 314, an interface 316, and a data bus. In some examples, additional peripheral circuits not shown in FIG. 3 may be included as well.

Page buffer/sense amplifier 304 can be configured to read and program (write) data from and to memory cell array 101 according to the control signals from control logic 312. In one example, page buffer/sense amplifier 304 may store one page of program data (write data) to be programmed into one page of memory cell array 101. In another example, page buffer/sense amplifier 304 may perform program verify operations to ensure that the data has been properly programmed into memory cells 106 coupled to selected word lines 118. In still another example, page buffer/sense amplifier 304 may also sense the low power signals from bit line 116 that represents a data bit stored in memory cell 106 and amplify the small voltage swing to recognizable logic levels in a read operation. Column decoder/bit line driver 306 can be configured to be controlled by control logic 312 and select one or more NAND memory strings 108 by applying bit line voltages generated from voltage generator 310.

Row decoder/word line driver 308 can be configured to be controlled by control logic 312 and select/deselect blocks 104 of memory cell array 101 and select/deselect word lines 118 of block 104. Row decoder/word line driver 308 can be further configured to drive word lines 118 using word line voltages generated from voltage generator 310. In some implementations, row decoder/word line driver 308 can also select/deselect and drive SSG lines 115 and DSG lines 113 as well. Row decoder/word line driver 308 can be configured to apply a read voltage to selected word line 118 in a read operation on memory cell 106 coupled to selected word line 118.

Voltage generator 310 can be configured to be controlled by control logic 312 and generate the word line voltages (e.g., read voltage, program voltage, pass voltage, local voltage, verification voltage, etc.), bit line voltages, and source line voltages to be supplied to memory cell array 101.

Control logic 312 can be coupled to each peripheral circuit described above and configured to control operations of each peripheral circuit. Registers 314 can be coupled to control logic 312 and include status registers, command registers, and address registers for storing status information, command operation codes (OP codes), and command addresses for controlling the operations of each peripheral circuit. The status registers of registers 314 can include one or more registers configured to store open block information indicative of the open block(s) of all blocks 104 in memory cell array 101, such as having an auto dynamic start voltage (ADSV) list. In some implementations, the open block information is also indicative of the last programmed page of each open block.

Interface 316 can be coupled to control logic 312 and act as a control buffer to buffer and relay control commands received from a host (not shown) to control logic 312 and status information received from control logic 312 to the host. Interface 316 can also be coupled to column decoder/ bit line driver 306 via a data bus and act as a data input/ output (I/O) interface and a data buffer to buffer and relay the data to and from memory cell array 101.

Figure 4:
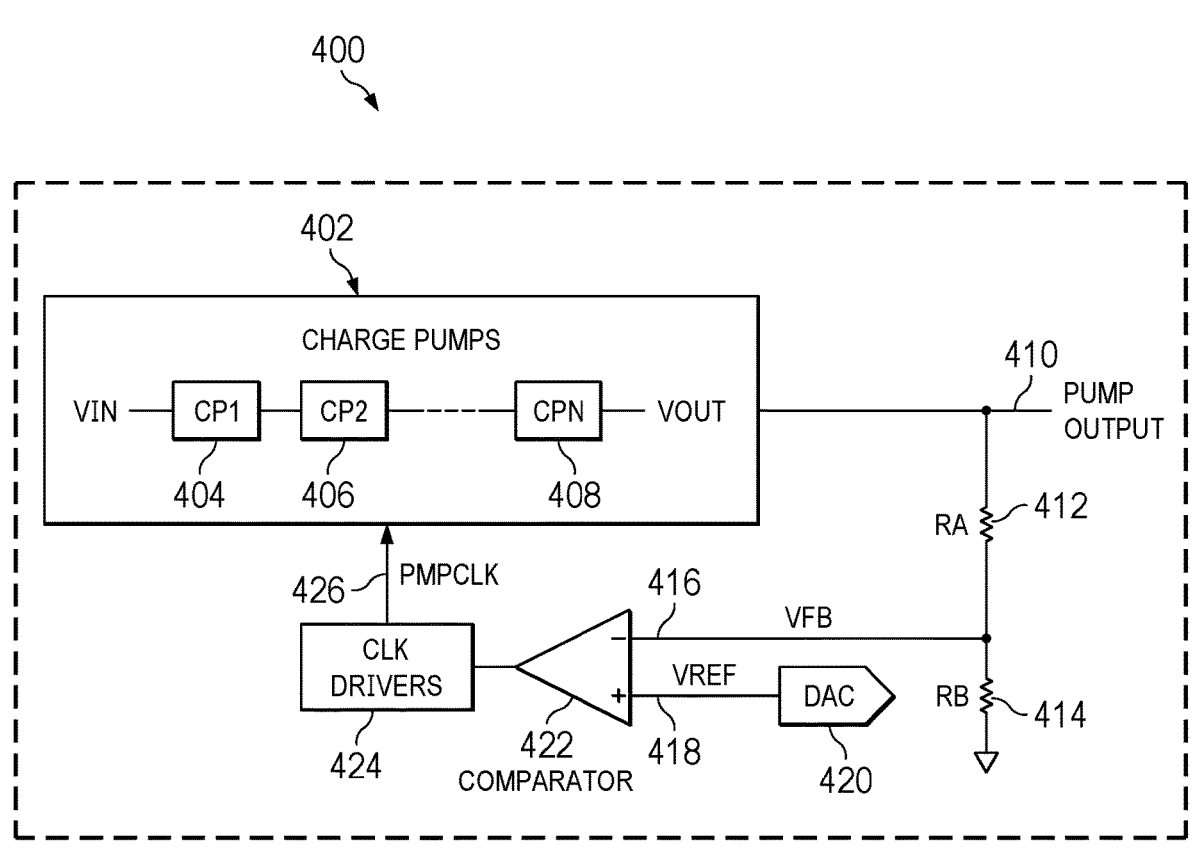
FIG. 4 illustrates an example circuit for charge pump voltage control, according to some aspects of the present disclosure.

FIG. 4 illustrates an example circuit 400 for charge pump voltage control. In some implementations, circuit 400 can be an example of voltage generator 310 in peripheral circuit 102. Circuit 400 can generate voltages such as word line voltages (e.g., read voltage, program voltage, pass voltage, local voltage, verification voltage, etc.) for memory cell array 101.

In some implementations, circuit 400 includes charge pumps 402, a charge pump output feedback circuit that includes multiple resistors, for example, resistors Ra 412 and Rb 414, a reference voltage generation circuit DAC 420, comparator 422 (e.g., second comparator), and a charge pump clock control circuit (e.g., clock drivers) CLK drivers 424.

Figures 5A, 5B:
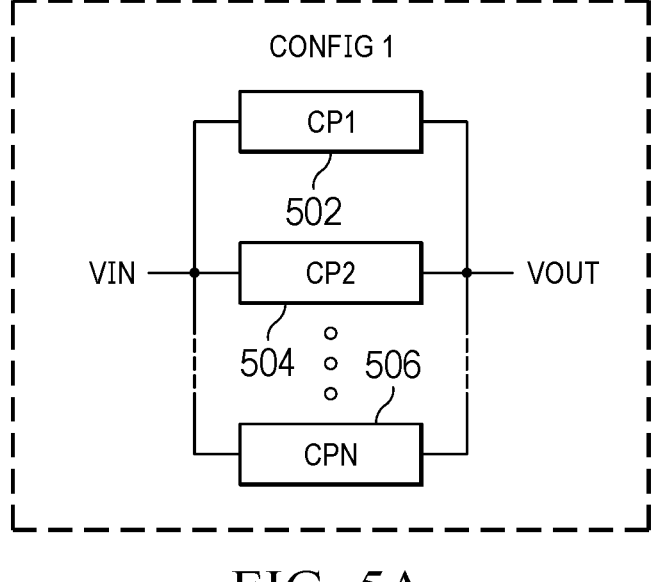
FIG. 5A illustrates an example of charge pumps in a parallel connection, according to some aspects of the present disclosure.
FIG. 5B illustrates an example of charge pumps in a series connection, according to some aspects of the present disclosure.

As shown in FIG. 4, charge pumps 402 in circuit 400 includes multiple charge pumps, for example, CP1 404, CP2 406, and CPN 408, in a series connection. An example of charge pumps in a series connection is also shown in FIG. 5B and described later. In some implementations, charge pumps 402 can include multiple charge pumps in a parallel connection, as shown in FIG. 5A and described later. The voltage output of circuit 400 is pump output 410 that equals the voltage output $V_{out}$ of the last charge pump CPN 408 in the set of charge pumps 402 in series connection.

In some implementations, feedback voltage $v_{fb}$ 416 is an output from the charge pump output feedback circuit and is linearly proportional to pump output 410, and the ratio of $v_{fb}$ 416 to pump output 410 is controlled by two resistors Ra 412 and Rb 414, as shown in Equation 1.

$$\frac{V_{out}}{R_a + R_b} = \frac{v_{fb}}{R_b} \qquad (1)$$

In some implementations, an operation mode (e.g., second operation mode) of charge pumps 402 regarding whether to stop increasing pump output 410 can be controlled by a comparison between feedback voltage $v_{fb}$ 416 and reference voltage $v_{ref}$ 418. The comparison is performed by comparator 422 in FIG. 4. When $v_{ref}$ 418 is larger than $v_{fb}$ 416, the output of comparator 422 is 1 and enables the charge pump clock control circuit CLK drivers 424 to output clock signal pmpclk 426 at a frequency such that charge pumps 402 can continue to increase pump output 410, and consequently $v_{fb}$ 416. When $v_{ref}$ 418 equals $v_{fb}$ 416, the output of comparator 422 is 0 and stops clock signal pmpclk 426 from toggling, and consequently stops charge pumps 402 from changing pump output 410, and consequently $v_{fb}$ 416. A charge pump operating period can include one or more time periods when $v_{ref}$ 418 is larger than $v_{fb}$ 416 and one or more time periods when $v_{ref}$ 418 equals $v_{fb}$ 416. During the charge pump operating period, the ratio of $v_{fb}$ 416 to pump output 410 is controlled by two resistors Ra 412 and Rb 414, according to Equation 1. In some implementations, when $v_{ref}$ 418 is larger than $v_{fb}$ 416, the output of comparator 422 is 0 and enables the charge pump clock control circuit CLK drivers 424 to output clock signal pmpclk 426 at a frequency such that charge pumps 402 can continue to increase pump output 410, and consequently $v_{fb}$ 416. When $v_{ref}$ 418 equals $v_{fb}$ 416, the output of comparator 422 is 1 and stops clock signal pmpclk 426 from toggling, and consequently stops charge pumps 402 from changing pump output 410, and consequently $v_{fb}$ 416.

Figure 6:
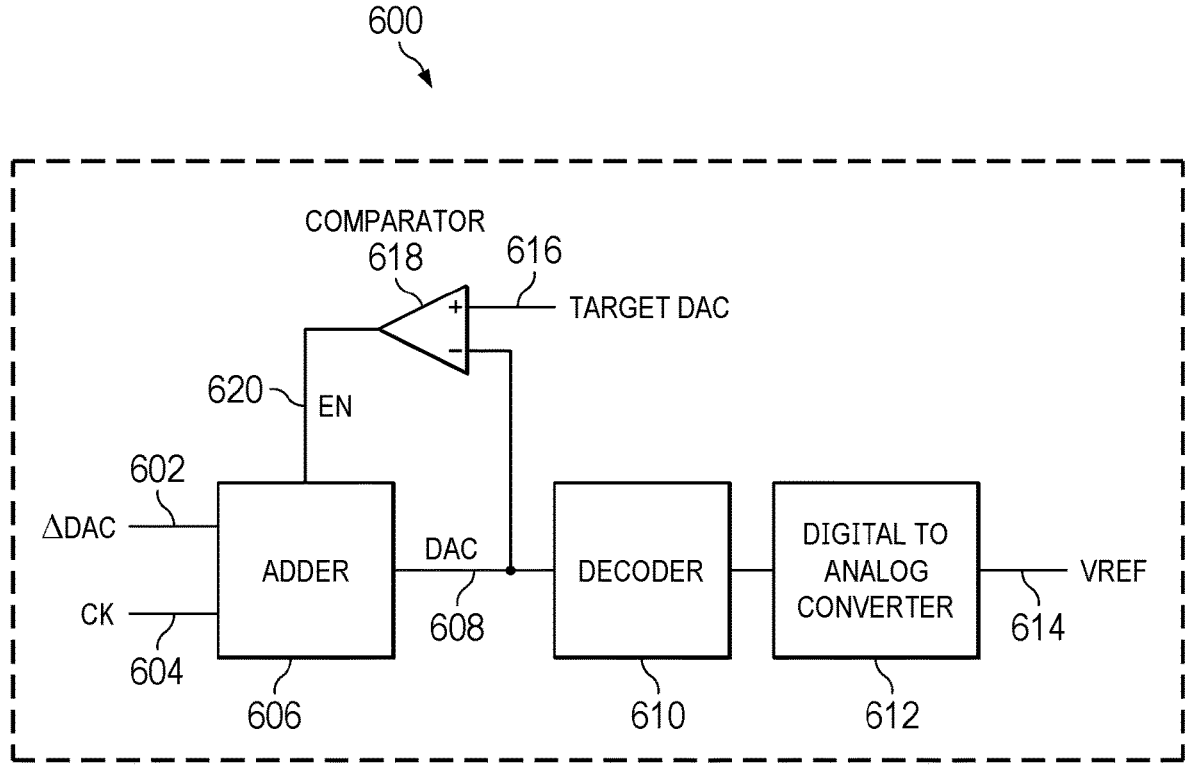
FIG. 6 illustrates an example of a reference voltage generation circuit, according to some aspects of the present disclosure.

In some implementations, the reference voltage $v_{ref}$ 418 is output from the reference voltage generation circuit (e.g., digital to analog converter (DAC) 420). An example of DAC 420 is shown in FIG. 6 and described later. When $v_{ref}$ 418 equals $v_{fb}$ 416, pump output 410 is linearly proportional to $v_{ref}$ 418, as shown in Equation 2. Therefore, pump output 410 can be controlled by adjusting $v_{ref}$ 418 through the reference voltage generation circuit DAC 420. For example, the rate of increase of pump output 410 can be controlled by setting different rates of increase of $v_{ref}$ 418 through the reference voltage generation circuit DAC 420, as shown in FIG. 6 and described later.

$$V_{out} = v_{ref} \times \frac{R_a + R_b}{R_b} \qquad (2)$$

FIG. 5A illustrates an example of charge pumps in a parallel connection. FIG. 5B illustrates an example of charge pumps in a series connection. In some implementations, when a set of charge pumps provide voltages to support operations in a 3D NAND flash memory, for example, when the set of charge pumps provide bias voltages to unselected word lines in the 3D NAND flash memory during a read operation of a memory cell of the 3D NAND flash memory, the main load of the set of charge pumps are from the capacitor associated with the unselected word line gates, where the capacitance can be a few nF. When the output voltage of the set of charge pumps increases, the output current of the set of charge pumps can charge the capacitor and increase the voltage of the unselected word line gate. Equation 3 shows that the output voltage V of the set of charge pumps is proportional to the output current I and time T. Q is the charge in the capacitor due to the charging operation of the set of charge pumps. C is the capacitance of the capacitor associated with the unselected word line gates.

$$Q = CV = IT \qquad (3)$$

In some implementations, when the output voltage of the set of charge pumps is relatively low, the parallel connection of the set of charge pumps in FIG. 5A can produce relatively high output current from the set of charge pumps. When the output voltage of the set of charge pumps continues to increase, the series connection of the set of charge pumps in FIG. 5B can produce relatively high output voltage from the set of charge pumps, and the set of charge pumps can switch from the parallel connection to the series connection when the output voltage of the set of charge pumps exceeds a threshold (e.g., switching threshold). In some implementations, the set of charge pumps can switch from the parallel connection to the series connection when the feedback voltage $v_{fb}$ 416 exceeds a threshold.

In some implementations, when the set of charge pumps switch from the parallel connection to the series connection, the output current and the efficiency of the set of charge pumps may change. When the output voltage $V_{out}$ of the set of charge pumps increases, the output current $I_{out}$ of the set of charge pumps decreases, and the efficiency of the set of charge pumps can increase first before decreasing. Equations 4 and 5 show the output current $i_{out}$ and the efficiency $\eta$ of the set of charge pumps respectively.

$$i_{out} = \frac{CV}{t} \qquad (4)$$

$$\eta = \frac{V_{out} \times I_{out}}{V_{in} \times I_{in}} \qquad (5)$$

FIG. 6 illustrates an example 600 of a reference voltage generation circuit. In some implementations, reference voltage generation circuit 600 can be an example of DAC 420. As shown in FIG. 6, reference voltage generation circuit 600 can include adder 606, comparator 618 (e.g., first comparator), decoder 610, and digital to analog converter 612. The output of reference voltage generation circuit 600 is a reference voltage $v_{ref}$ 614, which can be used to control the rate of increase of pump output 410 through circuit 400.

In some implementations, the input of adder 606 can include a step size $\Delta DAC$ 602 and a step frequency CK 604, and the output of adder 606 is a digital signal DAC 608. CK 604 can control the sampling time period of adder 606. By changing $\Delta DAC$ 602 and/or CK 604, DAC 608 can be controlled. For example, DAC 608 can increase by an amount of $\Delta DAC$ 602 over each sampling time period that equals the inverse of step frequency CK 604. DAC 608 then goes through decoder 610 such that DAC 608 is decoded by decoder 610. The output of decoder 610 then goes through digital to analog converter 612 such that the output of decoder 610, which is a digital signal, is converted to an analog signal, i.e., reference voltage $v_{ref}$ 614.

In some implementations, DAC 608 is compared to target DAC 616 in comparator 618 to control an operation mode (e.g., first operation mode) of adder 606 regarding whether to stop increasing DAC 608. For example, when DAC 608 is less than target DAC 616, comparator 618 outputs a signal En 620 to continue the operation of adder 606 to increase DAC 608 based on $\Delta DAC$ 602 and CK 604. When DAC 608 equals target DAC 616, comparator 618 outputs a signal En 620 to stop adder 606 from continuing to increase DAC 608.

Figure 7:
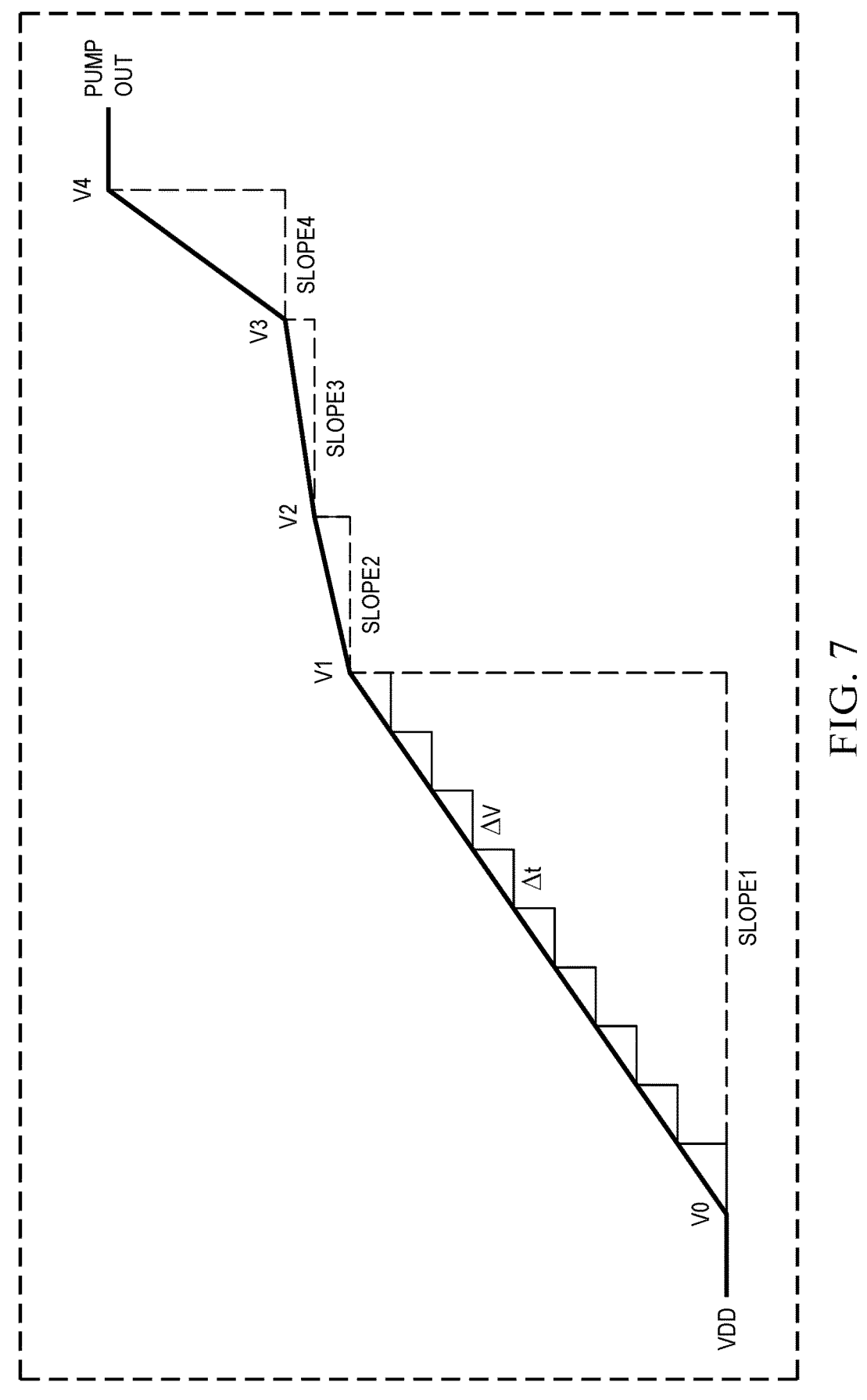
FIG. 7 illustrates an example of pump output 410, according to some aspects of the present disclosure.

Using circuit 400 and Equation 2, $v_{ref}$ 614 can be used to control pump output 410, as shown in FIG. 7 and described next.

FIG. 7 illustrates an example of pump output 410. The rate of increase of pump output 410 can be adjusted using $\Delta V$ and $\Delta t$. $\Delta V$ can be controlled by $\Delta DAC$ using Equation 2, and $\Delta t$ can be controlled as the inverse of step frequency CK 604. Five reference voltage switching points V0, V1, V2, V3, and V4 are shown in FIG. 7, where at each of the five switching points, the rate of increase of pump output 410 changes due to a change of $\Delta DAC$ 602 and/or a change of CK 604. Target DAC 616 in FIG. 6 can be used to control the level of pump output 410 at the end of slope4 segment in FIG. 7, which is the final value of pump output 410. Pump output 410 in FIG. 7 includes three segments. The first segment is before switching point V0 and has constant voltage Vdd. The second segment is between switching point V0 and switching point V4 and includes four subsegments with respective rates of increase of pump output 410, i.e., slope1, slope2, slope3, and slope4. The third segment is after switching point V4 and has constant voltage that is greater than Vdd. In some implementations, at switching point V1, the rate of increase of pump output 410 can decrease from slope1 to slope2 by decreasing $\Delta DAC$ 602 and consequently decreasing $\Delta V$, or by decreasing CK 604 and consequently increasing $\Delta t$. In some implementations, the set of charge pumps outputting pump output 410 can be connected in a parallel connection such as the one shown in FIG. 5A before switching point V2. Because pump output 410 continues to increase after switching point V2, the set of charge pumps can switch from the parallel connection to a series connection such as the one shown in FIG. 5B, after switching point V2. In some implementations, at switching point V3, the rate of increase of pump output 410 can increase from slope3 to slope4 by increasing $\Delta DAC$ 602 and consequently increasing $\Delta V$, or by increasing CK 604 and consequently decreasing $\Delta t$.

FIG. 8 illustrates an example of simulation results of charge pump output voltage and corresponding peak input current. Curves 1 and 2 show pump output voltages. Curves 3 and 4 show corresponding peak input currents. Curves 1 and 3 are generated based on a reference voltage with constant rate of change. Curves 2 and 4 are generated based on the reference voltage generation circuit illustrated in FIG. 6. Curve 2 shows that its pump output voltage is lower than that of curve 1 most of the time. Curve 4 shows that its peak input current is lower than that of Curve 3. Therefore, the reference voltage generation circuit illustrated in FIG. 6 can lower peak input current to charge pumps by adjusting the rate of increase of the reference voltage.

FIG. 9 illustrates an example of a flow chart of a method for controlling charge pump voltages in a memory device, according to some aspects of the present disclosure. At 902, a peripheral circuit of the memory device adjusts a rate of change of a reference voltage based on a step voltage and a step time duration, where adjusting the rate of change of the reference voltage includes changing the reference voltage by the step voltage over a time period that equals the step time duration.

At 904, the peripheral circuit generates an output voltage from one or more charge pumps using the reference voltage, where a ratio between the output voltage and the reference voltage is locked.

FIG. 10 illustrates a block diagram of an example system 1000 having a memory device, according to some aspects of the present disclosure. System 1000 can be a mobile phone, a desktop computer, a laptop computer, a tablet, a vehicle computer, a gaming console, a printer, a positioning device, a wearable electronic device, a smart sensor, a virtual reality (VR) device, an argument reality (AR) device, or any other suitable electronic devices having storage therein. As shown in FIG. 10, system 1000 can include a host 1008 and a memory system 1002 having one or more memory devices 1004 and a memory controller 1006. Host 1008 can be a processor of an electronic device, such as a central processing unit (CPU), or a system-on-chip (SoC), such as an application processor (AP). Host 1008 can be configured to send or receive data to or from memory devices 1004.

Memory device 1004 can be any memory device disclosed in the present disclosure. Memory controller 1006 is coupled to memory device 1004 and host 1008 and is configured to control memory device 1004, according to some implementations. Memory controller 1006 can manage the data stored in memory device 1004 and communicate with host 1008. In some implementations, memory controller 1006 is designed for operating in a low duty-cycle environment like secure digital (SD) cards, compact Flash (CF) cards, universal serial bus (USB) Flash drives, or other media for use in electronic devices, such as personal computers, digital cameras, mobile phones, etc. In some implementations, memory controller 1006 is designed for operating in a high duty-cycle environment SSDs or embedded multi-media-cards (eMMCs) used as data storage for mobile devices, such as smartphones, tablets, laptop computers, etc., and enterprise storage arrays. Memory controller 1006 can be configured to control operations of memory device 1004, such as read, erase, and program operations. Memory controller 1006 can also be configured to manage various functions with respect to the data stored or to be stored in memory device 1004 including, but not limited to bad-block management, garbage collection, logical-to-physical address conversion, wear leveling, etc. In some implementations, memory controller 1006 is further configured to process error correction codes (ECCs) with respect to the data read from or written to memory device 1004. Any other suitable functions may be performed by memory controller 1006 as well, for example, formatting memory device 1004.

Memory controller 1006 can communicate with an external device (e.g., host 1008) according to a particular communication protocol. For example, memory controller 1006 may communicate with the external device through at least one of various interface protocols, such as a USB protocol, an MMC protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a Firewire protocol, etc.

Figure 11A:
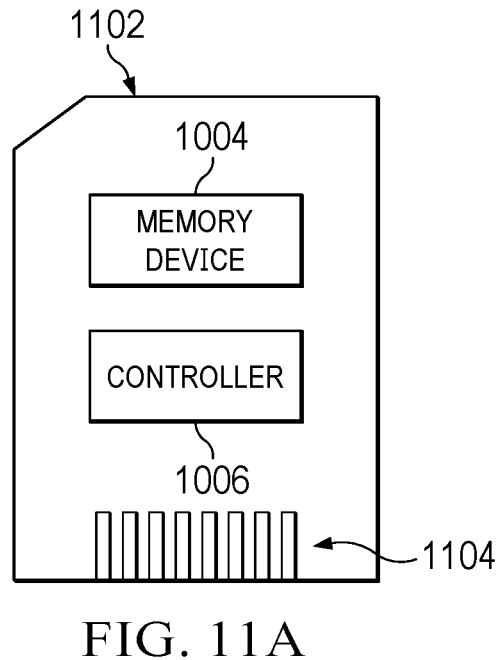
FIG. 11A illustrates a diagram of a memory card having a memory device, according to some aspects of the present disclosure.
Figure 11B:
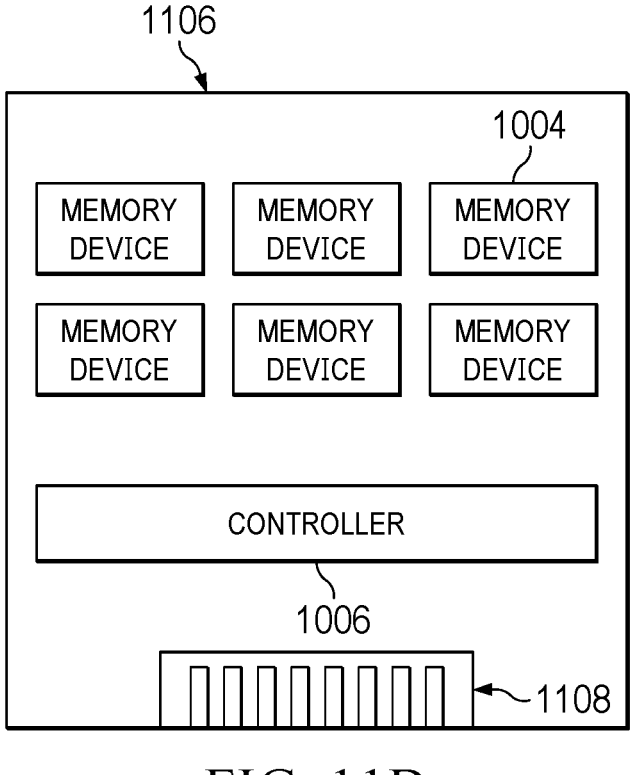
FIG. 11B illustrates a diagram of a solid-state drive (SSD) having a memory device, according to some aspects of the present disclosure.

Memory controller 1006 and one or more memory devices 1004 can be integrated into various types of storage devices, for example, be included in the same package, such as a universal Flash storage (UFS) package or an eMMC package. That is, memory system 1002 can be implemented and packaged into different types of end electronic products. In one example shown in FIG. 11A, memory controller 1006 and a single memory device 1004 may be integrated into a memory card 1102. Memory card 1102 can include a PC card (PCMCIA, personal computer memory card international association), a CF card, a smart media (SM) card, a memory stick, a multimedia card (MMC, RS-MMC, MMC-micro), an SD card (SD, miniSD, microSD, SDHC), a UFS, etc. Memory card 1102 can further include a memory card connector 1104 coupling memory card 1102 with a host (e.g., host 1008 in FIG. 10). In another example shown in FIG. 11B, memory controller 1006 and multiple memory devices 1004 may be integrated into an SSD 1106. SSD 1106 can further include an SSD connector 1108 coupling SSD 1106 with a host (e.g., host 1008 in FIG. 10). In some implementations, the storage capacity and/or the operation speed of SSD 1106 is greater than those of memory card 1102.

While this specification contains many specific implementation details, these should not be construed as limitations on the scope of what may be claimed, but rather as descriptions of features that may be specific to particular implementations. Certain features that are described in this specification in the context of separate implementations can also be implemented, in combination, in a single implementation. Conversely, various features that are described in the context of a single implementation can also be implemented in multiple implementations, separately, or in any sub-combination. Moreover, although previously described features may be described as acting in certain combinations and even initially claimed as such, one or more features from a claimed combination can, in some cases, be excised from the combination, and the claimed combination may be directed to a sub-combination or variation of a sub-combination.

As used in this disclosure, the terms "a," "an," or "the" are used to include one or more than one unless the context clearly dictates otherwise. The term "or" is used to refer to a nonexclusive "or" unless otherwise indicated. The statement "at least one of A and B" has the same meaning as "A, B, or A and B." In addition, the phraseology or terminology employed in this disclosure, and not otherwise defined, is for the purpose of description only and not of limitation. Any use of section headings is intended to aid reading of the document and is not to be interpreted as limiting; information that is relevant to a section heading may occur within or outside of that particular section.

As used in this disclosure, the term "about" or "approximately" can allow for a degree of variability in a value or range, for example, within 10%, within 5%, or within 1% of a stated value or of a stated limit of a range.

As used in this disclosure, the term "substantially" refers to a majority of, or mostly, as in at least about 50%, 60%, 70%, 80%, 90%, 95%, 96%, 97%, 98%, 99%, 99.5%, 99.9%, 99.99%, or at least about 99.999% or more.

Values expressed in a range format should be interpreted in a flexible manner to include not only the numerical values explicitly recited as the limits of the range, but also to include all the individual numerical values or sub-ranges encompassed within that range as if each numerical value and sub-range is explicitly recited. For example, a range of "0.1% to about 5%" or "0.1% to 5%" should be interpreted to include about 0.1% to about 5%, as well as the individual values (for example, 1%, 2%, 3%, and 4%) and the sub-ranges (for example, 0.1% to 0.5%, 1.1% to 2.2%, 3.3% to 4.4%) within the indicated range. The statement "X to Y" has the same meaning as "about X to about Y," unless indicated otherwise. Likewise, the statement "X, Y, or Z" has the same meaning as "about X, about Y, or about Z," unless indicated otherwise.

Particular implementations of the subject matter have been described. Other implementations, alterations, and permutations of the described implementations are within the scope of the following claims as will be apparent to those skilled in the art. While operations are depicted in the drawings or claims in a particular order, such operations are not required be performed in the particular order shown or in sequential order, or that all illustrated operations be performed (some operations may be considered optional), to achieve desirable results. In certain circumstances, multitasking or parallel processing (or a combination of multitasking and parallel processing) may be advantageous and performed as deemed appropriate.

Moreover, the separation or integration of various system modules and components in the previously described implementations are not required in all implementations, and the described components and systems can generally be integrated together or packaged into multiple products.

Accordingly, the previously described example implementations do not define or constrain the present disclosure. Other changes, substitutions, and alterations are also possible without departing from the spirit and scope of the present disclosure.

What is claimed is:

1. A circuit, comprising:
one or more charge pumps; and
a reference voltage generation circuit, wherein the reference voltage generation circuit comprises an adder configured to adjust a rate of change of an output voltage of the one or more charge pumps, wherein inputs of the adder comprise a step size and a step frequency, and wherein an output of the adder changes by the step size over a time period that equals an inverse of the step frequency to adjust the rate of change of the output voltage.

2. The circuit according to claim 1, wherein the reference voltage generation circuit further comprises a first comparator coupled to the adder, inputs of the first comparator comprise a threshold and the output of the adder, and an output of the first comparator controls a first operation mode of the adder based on a comparison between the threshold and the output of the adder.

3. The circuit according to claim 1, wherein the reference voltage generation circuit further comprises a decoder configured to generate an output for decoding the output of the adder.

4. The circuit according to claim 3, wherein the reference voltage generation circuit further comprises a digital to analog converter coupled to the output of the decoder, wherein the digital to analog converter is configured to convert the decoded output of the adder to a reference voltage as an output of the reference voltage generation circuit.

5. The circuit according to claim 1, wherein the reference voltage generation circuit is configured to output a reference voltage based on the output of the adder during a charge pump operating period, and the charge pump operating period comprises one or more time periods during which a ratio between the output voltage of the one or more charge pumps and the reference voltage is locked.

6. The circuit according to claim 5, wherein the reference voltage in the charge pump operating period comprises three consecutive segments including a first segment, a second segment, and a third segment, the reference voltage in the first segment is a first constant, and the reference voltage in the third segment is a second constant greater than the first constant.

7. The circuit according to claim 6, wherein the second segment comprises two or more consecutive subsegments corresponding to two or more rates of change of the reference voltage.

8. The circuit according to claim 5, wherein the circuit further comprises a charge pump output feedback circuit configured to output a feedback voltage during the charge pump operating period, and a ratio of the feedback voltage to the output voltage of the one or more charge pumps during the charge pump operating period is predetermined.

9. The circuit according to claim 8, wherein the charge pump output feedback circuit comprises a plurality of resistors.

10. The circuit according to claim 8, wherein the circuit further comprises a second comparator, inputs of the second comparator comprise the feedback voltage and the reference voltage, and an output of the second comparator controls a second operation mode of the one or more charge pumps based on a comparison between the feedback voltage and the reference voltage.

11. The circuit according to claim 10, wherein the circuit further comprises one or more clock drivers, input of the one or more clock drivers is the output of the second comparator, and the one or more clock drivers are configured to provide one or more clock signals to the one or more charge pumps based on the output of the second comparator.

12. The circuit according to claim 1, wherein a configuration of the one or more charge pumps comprises a series connection of the one or more charge pumps or a parallel connection of the one or more charge pumps.

13. The circuit according to claim 12, wherein the configuration of the one or more charge pumps is switched from the parallel connection to the series connection when the output voltage of the one or more charge pumps is greater than a switching threshold.

14. A method, comprising:
adjusting a rate of change of a reference voltage based on a step voltage and a step time duration, wherein adjusting the rate of change of the reference voltage comprises changing the reference voltage by the step voltage over a time period that equals the step time duration; and
generating an output voltage from one or more charge pumps using the reference voltage, wherein a ratio between the output voltage and the reference voltage is locked.

15. The method according to claim 14, wherein a configuration of the one or more charge pumps comprises a series connection of the one or more charge pumps or a parallel connection of the one or more charge pumps, and the method further comprises:
determining that an output voltage of the one or more charge pumps is greater than a switching threshold; and
in response to determining that the output voltage of the one or more charge pumps is greater than the switching threshold, switching the configuration of the one or more charge pumps from the parallel connection to the series connection.

16. The method according to claim 14, wherein adjusting the rate of change of the reference voltage further comprises:
determining that the reference voltage is greater than or equal to a voltage threshold; and
in response to determining that the reference voltage is greater than or equal to the voltage threshold, setting the rate of change of the reference voltage to zero.

17. The method according to claim 14, wherein adjusting the rate of change of the reference voltage further comprises changing the step voltage or changing the step time duration.

18. The method according to claim 14, wherein a length of the step time duration is an inverse of a step frequency, and adjusting the rate of change of the reference voltage based on the step voltage and the step time duration comprises adjusting the rate of change of the reference voltage based on the step voltage and the step frequency.

19. The method according to claim 14, wherein generating the output voltage from the one or more charge pumps based on the reference voltage comprises comparing the reference voltage to a feedback voltage to determine an operation mode of the one or more charge pumps, and a ratio of the feedback voltage to the output voltage of the one or more charge pumps is predetermined.

20. A memory device, comprising:

a memory cell array comprising memory cells; and a circuit, comprising:

one or more charge pumps operable to provide an output voltage to a word line coupled to one of the memory cells of the memory cell array; and a reference voltage generation circuit, wherein the reference voltage generation circuit comprises an adder configured to adjust a rate of change of an output voltage of the one or more charge pumps, wherein inputs of the adder comprise a step size and a step frequency, and wherein an output of the adder changes by the step size over a time period that equals an inverse of the step frequency to adjust the rate of change of the output voltage.

\* \* \* \* \*